TUNER DRIVE ASSEMBLY

Filed Oct. 8, 1953 2 Sheets-Sheet 1

INVENTOR.
James A. Neese
BY
Forman L. Mueller
Attys.

Oct. 29, 1957 J. A. NEESE 2,811,046
TUNER DRIVE ASSEMBLY
Filed Oct. 8, 1953 2 Sheets-Sheet 2
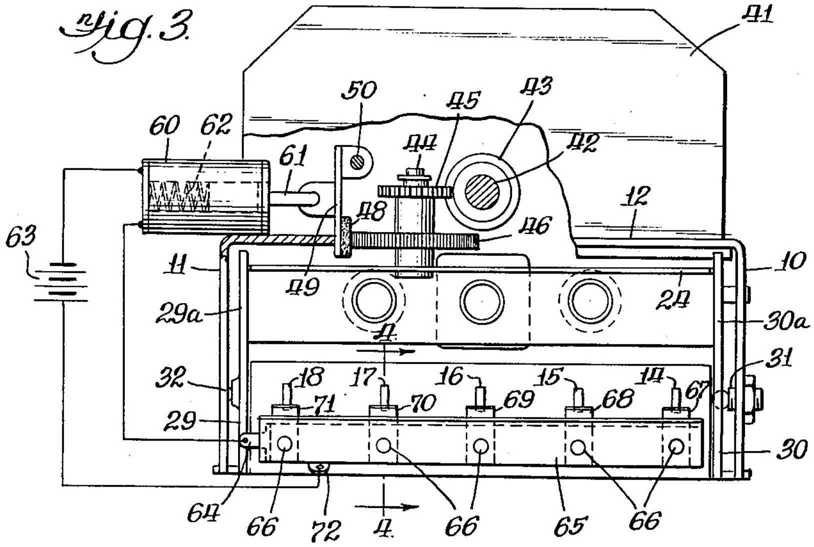
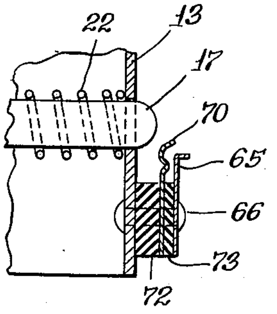
Fig. 4
Fig. 5
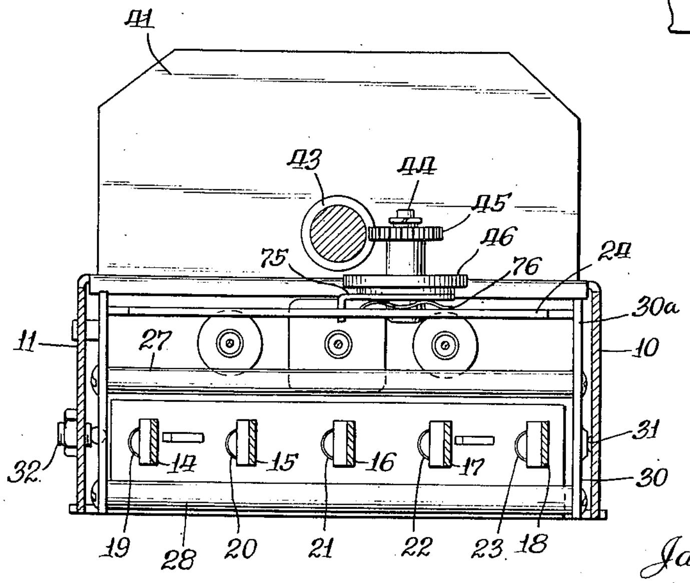
INVENTOR.
James A. Neese
BY
Foorman L. Mueller
Attys Patented Oct. 29, 1957

2,811,046

TUNER DRIVE ASSEMBLY

James A. Neese, Elmhurst, Ill., assignor to Motorola, Inc., Chicago, Ill., a corporation of Illinois Application October 8, 1953, Serial No. 384,844

12 Claims. (Cl. 74—10.54)

The present invention relates to tuner drive assemblies, and more particularly to an improved push button tuner drive capable of tuning a radio receiver directly to any one of a series of selected signal frequencies within a frequency range or, alternately, of tuning the receiver continuously through the range.

Push button tuners are well known to the art, and such tuners are capable of tuning a radio receiver directly to any one of a plurality of selected signals merely by depressing a corresponding push button. It is desirable in this type of tuner to incorporate some type of continuous control so that the receiver may be tuned to signal frequencies other than those that can be selected by the push buttons. It has been usual practice, therefore, to provide in this type of tuner a control member for such continuous tuning, and this control member is usually mechanical coupled to the tuner mechanism through a friction or other type of clutch arrangement. The arrangement is such that whenever any one of the push buttons is depressed to actuate the tuner to a pre-selected signal frequency, the clutch automatically releases the continuous control member. This type of tuner has proven satisfactory to some extent except that it has been found difficult and expensive to construct a friction clutch which, when in its operative condition, establishes a positive drive between the continuous control member and the tuner without undue slippage.

It is, accordingly, an object of the present invention to provide an improved and simplified tuner drive assembly in which push button and continuous operation may be achieved without the need of any type of clutch arrangement.

A more general object of the invention is to provide an improved and simplified tuner drive assembly that is capable of tuning a receiver directly to any one of a number of predetermined signal frequencies in a frequency range and which is also capable of tuning the receiver continuously throughout the frequency range.

Yet a further object of the invention is to provide such a tuner drive assembly in which the continuous tuning member is positively linked to the tuner with no slippage tendencies and yet which may be easily disengaged for push button operation.

A feature of the invention is the provision of an improved tuner drive assembly which incorporates a continuous tuning member positively coupled to an adjustable tuning carriage through a means including a wheel rotatably mounted on the carriage, the arrangement being such that rotation of the tuning member transmits motion to the carriage but any shifting of the carriage by other means does not transmit motion to the tuning member.

Another feature of the invention is the provision of an improved tuner drive assembly which incorporates a continuous tuning member positively coupled to an adjustable tuning carriage through a means including a wheel rotatably mounted on the carriage, and in which a rolling surface or raceway is selectively provided for the wheel so that motion may be transmitted from the continuous tuning member to the carriage when so desired.

Yet another feature of the invention is the provision of such an improved tuner drive assembly which incorporates a series of push buttons for moving the carriage to selected positions along a line of motion, and in which the push buttons are linked to the rolling surface selectively to move the rolling surface to a disengaged position whenever they are depressed so as to free the carriage from the control of the manual tuning means.

The above and other features of the invention which are believed to be new are set forth with particularity in the appended claims. The invention itself, however, together with further objects and advantages thereof, may best be understood by reference to the following description when taken in conjunction with the accompanying drawings in which:

Figure 3 is a view of the tuner, similar to Figure 2, but incorporating a modified control arrangement;

Figure 4 is a sectional view taken along the lines 4—4 of Figure 3; and

Figure 5 is a view of the tuner, similar to Figure 2, but incorporating still another control arrangement.

The improved tuner drive assembly of the present invention comprises a movable carriage with a disc-like element rotatably mounted thereon. Control means is provided for imparting rotational motion to the disc-like element, and further means is provided for selectively presenting a rolling surface for the periphery of the disc-like element to produce relative motion between the movable carriage and such surface. In this manner, the tuner may be tuned continuously by the movable carriage when the rolling surface is presented to the periphery of the disc-like element. However, when the rolling surface is disengaged from the disc-like element, the movable carriage may be moved freely by push buttons, with the disc-like element rotating as the movable member is so moved and no motion being transmitted to the control means.

Figure 1:
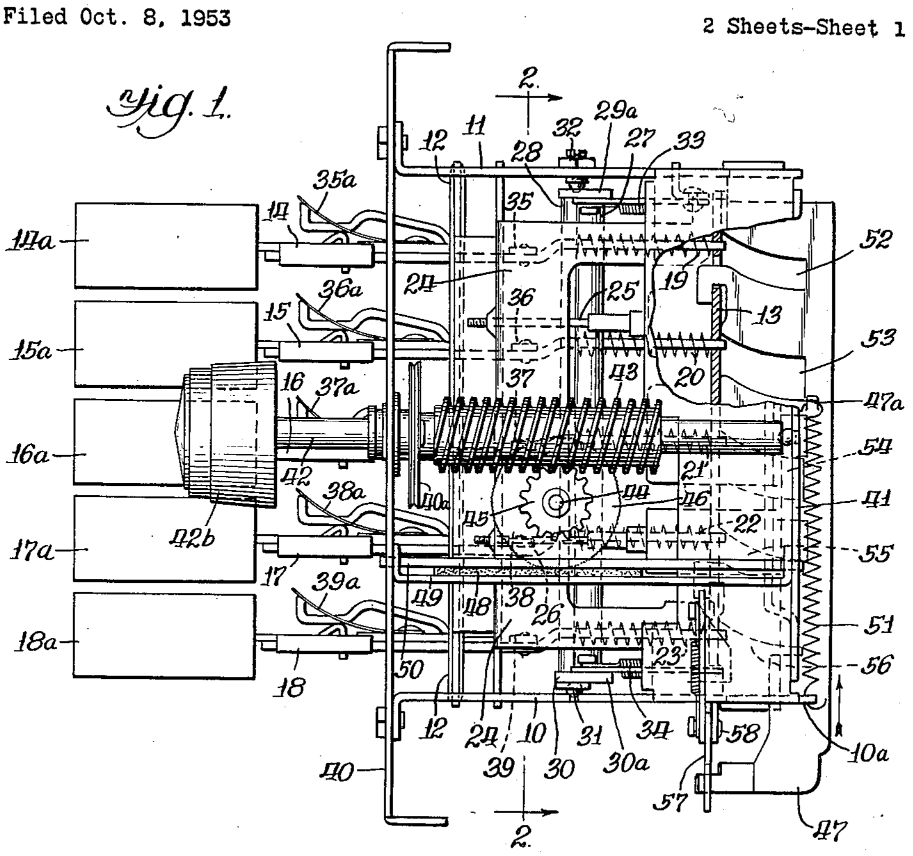
Figure 1 is a plan view, partly in section, of the improved tuner drive assembly of the invention.

The tuner of Figure 1 includes a pair of spaced, parallel supporting side brackets 10 and 11 with a further pair of supporting end brackets 12 and 13 secured thereto and extending between the side brackets in spaced parallel relation. A series of push button arms 14—18 are slidably supported in brackets 12 and 13 and are biased to the left of the drawing by respective coil springs 19—23. The coil springs each has one end bearing against bracket 13 and each has its other end bearing against a suitable shoulder on the corresponding push button arm. The push button arms have respective further shoulders which bear against bracket 12 and limit the movement of the arms under the biasing action of springs 19—23. The push button arms are respectively actuated by the usual individual push buttons **14*a*—18*a***.

The tuner drive assembly also includes a carriage 24 which is slidably supported in slots in the side brackets 10 and 11. A pair of actuating arms 25 and 26 (or more when so desired) for the usual tuning cores of the inductance coils of the receiver are secured to the carriage 24 so that the tuning cores are moved in and out of their respective inductance coils as the carriage is moved reciprocally on brackets 10 and 11 along its line of motion.

The assembly also includes two spaced parallel rods 27 and 28 which function as a treadle and which extend between the side brackets 10 and 11. The rods are joined together by arms 29 and 30 at the respective ends thereof, and these arms are pivoted to the side brackets by pivots 31 and 32. One end of each of the arms 29 and 30 have respective extended portions 29a and 30a which are linked to carriage 24 by respective linkages 33 and 34. A series of rotatable stops 35—39 are mounted on the respective push button arms 14—18 and engage the treadle rods 27 and 28 in known fashion to provide desired angular positions of the rods and corresponding desired lateral positions of carriage 24. The inclination of the stops 35—39 is controlled also in known manner by control arms 35a—39a respectively mounted on push button arms 14—18.

By the structure described above, the rotatable stop 35, for example, on push button arm 14 may be adjusted to have a certain inclination by control member 35a. Then, when push button 14a is depressed, moving arm 14 to the right of the drawing against the spring 19, stop 36 engages the treadle rods 27 and 28 and rotates them to a selected angular position. This moves carriage 24 along its line of motion to a selected position along brackets 10 and 11 to tune the receiver to a desired signal frequency. In this manner, the receiver may be tuned to any one of a series of preselected signals merely by depressing the corresponding push buttons 14a—18a.

As previously stated, it is also desired to provide a means for tuning the receiver continuously through the frequency range and this is accomplished in the manner now to be described. The tuner drive assembly is also provided with a front mounting plate 40 and a rear mounting plate 41, both supported on the side brackets 10 and 11. A drive shaft 42 is rotatably mounted on front plate 40 and is coupled to a worm gear 43 through a suitable coupling 40a, the worm gear 43 being rotatably mounted between the front plate 40 and the rear plate 41 and extending parallel to the line of motion of carriage 24. Coupling means 40a may comprise a pair of frictionally engaged discs, and shaft 42 is illustrated as coupled through the coupling means to the worm gear 43 merely because under some circumstances it is desirable to have shaft 42 moved upwardly on front plate 40 for mounting and convenience of control reasons. However, when so desired, shaft 42 may be an extension of the worm gear 43. A usual control knob 42b is provided at the outer extremity of shaft 42. A bearing stud 44 is mounted on carriage 24 and extends upwardly from the carriage in a direction perpendicular to the line of reciprocal motion of the carriage. A spur gear 45 is rotatably mounted on stud 44 and engages the worm 43 for rotation thereby. In addition, a disc-like element in the form of a roller or brake wheel 46 is rotatably mounted on stud 44 and is molded or otherwise attached to the spur gear 45. The wheel has a knurled peripheral surface, and its diameter may be greater or smaller than the spur gear depending upon the desired driving ratio.

The assembly also includes an elongated strip or raceway pad 48, for example of brake lining material, which is glued or otherwise affixed to a raceway plate 49 which, in turn, is pivotally mounted on a bar 50 extending between the front plate 40 and rear plate 41. Raceway plate 49 and pad 48 extend adjacent wheel 46 along an axis parallel to the line of motion of carriage 24, and pad 48 presents a rolling surface to the knurled periphery of wheel 46 when it is brought into engagement with the wheel by movement of plate 49 about its pivotal axis 50.

A control bar 47 is slidably mounted for transverse motion in slots in back plate 13, and bar 47 is biased in the opposite direction of the arrow by tension spring 51. The spring is secured to a protruding eyelet 10a on side bracket 10 and to an ear 47a formed on bar 47. Bar 47 has a series of slots 52—56 respectively facing the ends of the push button arms 14—18. These slots, in each instance, define a curved cam surface for the end of the corresponding push button arm so that when any one of the push buttons is depressed, the end of its arm enters its corresponding slot in bar 47 and moves the bar in the direction of the arrow against the tension of spring 51.

Figure 2:
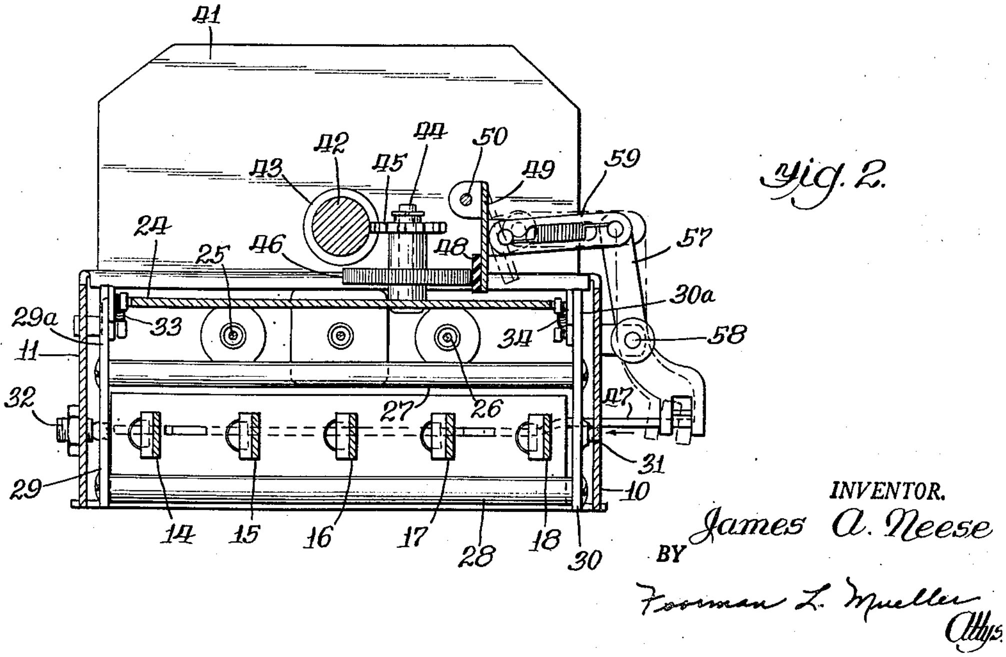
Figure 2 is a sectional view of the tuner taken along the lines 2—2 of Figure 1.

An arm 57 is pivoted to side bracket 10 by a pivot 58, and this arm has one end coupled to bar 47. The other end of arm 57 is coupled to the raceway plate 49 by a spring-loaded link 59. The linkage mechanism formed by arm 57 and link 59 causes the pad 48 to bear against the knurled peripheral surface of wheel 46 when the push button arms are in their illustrated disengaged position, and the pad is firmly held in this position by spring 51. However, when any one of the push buttons is depressed so that the end of its arm enters the corresponding slot in bar 47, the bar is driven in the direction of the arrow, and the above mentioned linkage mechanism causes plate 49 to pivot on rod 50 so as to move pad 48 away from the knurled peripheral surface of wheel 46. This frees carriage 24 for selective positioning by the push button arm in the manner described previously herein. In Figure 2, the solid line representation of the linkage mechanism and plate 49 shows these elements in the position corresponding to the condition when none of the push buttons is depressed, while the dotted line representation shows the position of the elements when any one of the push buttons is depressed.

With the push buttons in their illustrated disengaged position, rotation of knob 42b causes shaft 42 to rotate which, in turn, rotates worm gear 43. This causes spur gear 45 to rotate about shaft 44 and, since wheel 46 is affixed to the pinion, causes the wheel to roll along the rolling surface presented by pad 48. As the wheel rolls along the rolling surface, carriage 24 is moved along its line of motion tuning the receiver continuously through the selected frequency range.

Whenever a push button is depressed, it first actuates the linkage mechanism described previously to move pad 48 out of engagement with the peripheral surface of wheel 46. Under this condition, rotation of knob 42b with resulting rotation of worm 43 and spur gear 45 causes no motion of carriage 24 since the pinion and wheel 46 merely rotate freely around stud 44. Carriage 24 is therefore freed from the continuous control means 42, 43 and may be adjusted to any desired position by the push buttons without hindrance from the continuous control means. Such adjustment of the carriage merely causes spur gear 45 to rotate freely on worm 43. The entire assembly may be manufactured relatively inexpensively and has been found to operate with a high degree of efficiency as compared to the types using frictional or other clutch mechanisms. Apart from the fact of inherent simplicity, the structure has been found to be freely adjustable under the control of the push buttons and to be actuatable without slippage under the control of the continuous adjustment means.

In the embodiment of Figures 3 and 4, electromagnetic rather than mechanical control means are used to pivot plate 49 about shaft 50 whenever one of the push buttons is depressed. In the latter embodiment, a solenoid 60 is mounted on bracket 12 adjacent the pivot plate 49 and has a plunger 61 mechanically coupled to the pivot plate. The plunger is normally biased to the right of the drawing by a coil spring 62 within solenoid 60. The solenoid has a coil with a pair of leads extending therefrom, one of the leads being directly connected to one terminal of a potential source 63 and the other lead being connected to a terminal 64 on the tuner.

As more clearly shown in Figure 4, a metallic strip 65 is mounted on end bracket 13 by a series of rivets 66, and a series of resilient metallic elements 67—71 are likewise mounted on the bracket by the rivets and insulated from the bracket and strip 65 by insulating spacers such as spacers 72 and 73. The resilient elements are connected together by a suitable connector (not shown) and are connected to terminal 64. The strip 65 is connected to a terminal 72 which, in turn, is connected to the other terminal of source 63.

The resilient elements 67—71 are mounted adjacent the ends of the respective push button arms 14—18, so that when any one of the push buttons is depressed, one of the elements 67—71 is pushed against strip 65 closing an electrical connection between terminals 64 and 72. This completes the electrical circuit to the solenoid and causes plunger 61 to be drawn into the solenoid against spring 62. Therefore, when none of the push buttons is depressed, the solenoid is de-energized and spring 62 and plunger 61 bias the plate 49 in an anticlockwise direction to hold pad 48 firmly against wheel 46. As in the latter embodiment, rotation of continuous tuning shaft under these conditions causes worm 43 to move carriage 24 along its line of motion. However, when any one of the push buttons is depressed, the solenoid 60 is energized which frees wheel 46 and allows the carriage freely to be moved by the corresponding push button arm to a selected tuning position.

In the embodiment of Figure 5, no control means from the push buttons is required, spur 45 and wheel 46 being mounted in a manner to be described to allow continuous tuning and push button tuning without any such control means. In this embodiment a dog washer 75 and a deformed spring washer 76 are interposed on stud 44 between wheel 46 and carriage 24.

The spring washer biases the dog washer against wheel 46 so that the wheel and spur 45 are frictionally retained against rotation. When worm 43 is rotated, the tooth of spur 45 engaging the worm is moved along the worm in a cam and cam follower relation, the spur being held against rotation by the washers 75 and 76. This causes motion to be transmitted from the worm to carriage 24 and the carriage is moved along its line of motion. When any one of the push buttons is depressed its corresponding arm engages treadle 27, 28 and moves the carriage to its selected tuning position, such motion overcoming the friction of washers 75 and 76 and allowing spur 45 to rotate along the worm 43.

The invention provides, therefore, a new and improved tuner drive assembly that may be constructed economically and which functions with a high degree of efficiency to perform its intended function.

While particular embodiments of the invention have been shown and described, modifications may be made and it is intended in the appended claims to cover all such modifications as fall within the true spirit and scope of the invention.

I claim:

1. A tuner drive assembly including in combination, supporting bracket means, a carriage movably mounted on said bracket means, a wheel rotatably mounted on said carriage, means for imparting rotational motion to said wheel, means movably mounted on said bracket means providing rolling surface adjacent the periphery of said wheel and engageable therewith to produce relative motion between said carriage and said bracket means upon rotation of said wheel, and means to move said rolling surface means into and out of engagement with the periphery of said wheel.

2. A tuner drive assembly including in combination, supporting bracket means, a carriage slidably mounted on said bracket means for reciprocal movement along a selected line of motion, a wheel rotatably mounted on said carriage with its axis of rotation extending perpendicularly to the line of motion of said carriage, means for imparting rotational motion to said wheel, a control member mounted on said bracket means adjacent said wheel and providing a rolling surface for the periphery of said wheel extending parallel to the line of motion of said carriage, and means for actuating said control member to move said rolling surface in and out of engagement with the periphery of said wheel and provide selective relative motion between said carriage and said bracket means.

3. A tuner drive assembly including in combination, supporting bracket means, a carriage slidably mounted on said bracket means for reciprocal movement along a selected line of motion, a wheel rotatably mounted on said carriage with its axis of rotation extending perpendicularly to the line of motion of said carriage, a drive shaft coupled to said wheel for imparting rotational motion to said wheel, an elongated strip pivotally mounted on said bracket means adjacent said wheel on an axis parallel to the line of motion of said carriage, said strip providing a rolling surface for the periphery of said wheel extending parallel to the line of motion of said carriage, and linkage means for pivoting said strip about its aforesaid axis to move said rolling surface in and out of engagement with the periphery of said wheel and provide selective relative motion between said carriage and said bracket means.

4. A tuner drive assembly including in combination, supporting bracket means, a carriage slidably mounted on said bracket means for reciprocal movement along a selected line of motion, a wheel rotatably mounted on said carriage with its axis of rotation extending perpendicularly to the line of motion of said carriage, a drive shaft coupled to said wheel for imparting rotational motion to said wheel, an elongated strip pivotally mounted on said bracket means adjacent said wheel on an axis parallel to the line of motion of said carriage, said strip providing a rolling surface for the periphery of said wheel extending parallel to the line of motion of said carriage, means including a resilient member for biasing said strip about its axis in a direction to maintain said rolling surface in engagement with the periphery of said wheel, and means for moving said strip about its axis in a direction to move said rolling surface out of engagement with the periphery of said wheel and shift said carriage selectively to prelocated positions along its line of travel.

5. A tuner drive assembly including in combination, supporting bracket means, a carriage slidably mounted on said bracket means for reciprocal movement along a selected line of motion, a wheel rotatably mounted on said carriage with its axis of rotation extending perpendicularly to the line of motion of said carriage, a drive shaft coupled to said wheel for imparting rotational motion to said wheel, an elongated strip pivotally mounted on said bracket means adjacent said wheel on an axis parallel to the line of motion of said carriage, said strip providing a rolling surface for the periphery of said wheel extending parallel to the line of motion of said carriage, a linkage mechanism including a resilient member for biasing said strip about its axis in a direction to maintain said rolling surface in engagement with the periphery of said wheel, and a series of push button members slidably mounted on said supporting bracket means for individually actuating said linkage mechanism to move said strip about its axis in a direction to move said rolling surface out of engagement with the periphery of said wheel and for selectively shifting said carriage to respective prelocated positions along its line of travel.

6. A tuner drive assembly including in combination, supporting bracket means, a carriage slidably mounted on said bracket means for reciprocal movement along a selected line of motion, a spur gear rotatably mounted on said carriage with its axis of rotation extending perpendicularly to the line of motion of said carriage, a worm gear rotatably mounted on said bracket means in meshing engagement with said spur gear and with its axis extending parallel to the line of motion of said carriage, a wheel rotatably mounted on said carriage coaxially with said spur gear and affixed thereto, an elongated strip pivotally mounted on said bracket means adjacent said wheel on an axis parallel to the line of motion of said carriage, said strip providing a rolling surface for the periphery of said wheel extending parallel to the line of motion of said carriage, and linkage means for pivoting said strip about its aforesaid axis to move said rolling surface in and out of engagement with the periphery of said wheel and provide selective relative motion between said carriage and said bracket means.

7. A tuner drive assembly including in combination, supporting bracket means, a carriage slidably mounted on said bracket means for reciprocal movement along a selected line of motion, a bearing stud mounted on said carriage with its axis extending perpendicularly to the line of motion of said carriage, a spur gear rotatably mounted on said stud, a drive shaft rotatably mounted on said bracket means and including a worm portion engaging said spur gear for imparting rotational motion thereto, a wheel rotatably mounted on said stud and affixed to said spur gear, an elongated strip pivotally mounted on said bracket means adjacent said wheel on an axis parallel to the line of motion of said carriage to provide a rolling surface for the periphery of said wheel, a control means for actuating said strip about its axis and including a resilient member for biasing said strip in a direction to maintain said rolling surface in engagement with the periphery of said wheel, and a series of push button members slidably mounted on said supporting bracket means for individually actuating said control means to move said strip in a direction to disengage said rolling surface from the periphery of said wheel and for selectively shifting said carriage to prelocated positions along its line of motion.

8. A tuner drive assembly including in combination, supporting bracket means, a carriage slidably mounted on said bracket means for reciprocal movement along a selected line of motion, a bearing stud mounted on said carriage with its axis extending perpendicularly to the line of motion of said carriage, a spur gear rotatably mounted on said stud, a drive shaft rotatably mounted on said bracket means and including a worm portion engaging said spur gear for imparting rotational motion thereto, a wheel rotatably mounted on said stud and affixed to said spur gear, an elongated strip pivotally mounted on said bracket means adjacent said wheel on an axis parallel to the line of motion of said carriage, said strip providing a rolling surface for the periphery of said wheel extending parallel to the line of motion of said carriage, a solenoid including plunger means mechanically coupled to said strip, resilient means for biasing said strip about its axis in a direction to maintain said rolling surface in engagement with the periphery of said wheel, a series of push button members slidably mounted on said supporting bracket means, and electrical contact means actuated by said push button members for energizing said solenoid to move said strip about its axis in a direction to disengage said rolling surface with the periphery of said wheel.

9. In a tuner assembly which includes, supporting bracket means, a carriage slidably mounted on the bracket means for reciprocal movement along a selected line of motion, and a series of push button members slidably mounted on the bracket means for selectively shifting said carriage to prelocated positions along its line of travel, the combination of a bearing stud mounted on the carriage with its axis extending perpendicularly to the line of motion of the carriage, a spur gear rotatably mounted on said stud, a drive shaft rotatably mounted on the bracket means and including a worm portion engaging said spur gear for imparting rotational motion thereto; a wheel rotatably mounted on said stud and affixed to said spur gear, an elongated strip pivotally mounted on the bracket means adjacent said wheel on an axis parallel to the line of motion of the carriage to provide a rolling surface for the periphery of said wheel, control means for actuating said strip about its axis and including a resilient member for biasing said strip in a direction to maintain said rolling surface in engagement with the periphery of said wheel, and means actuated by the push button members for actuating said control means to move said strip in a direction to disengage said rolling surface with the periphery of said wheel.

10. A tuner drive assembly including in combination, supporting bracket means, a carriage slidably mounted on said bracket means for reciprocal movement along a selected line of motion, rotary means including a spur gear rotatably mounted on said carriage with its axis extending perpendicularly to the line of motion of said carriage, a worm gear rotatably mounted on said bracket means in meshing engagement with said spur gear and with its axis extending parallel to the line of motion of said carriage, means engageable with said carriage to move the same with said spur gear rolling along said worm gear, and means engaging said rotary means to restrict the free rotation thereof and provide relative motion between said carriage and said bracket means upon rotation of said worm gear.

11. A tuner drive assembly including in combination, supporting bracket means, a carriage slidably mounted on said bracket means for reciprocal movement along a selected line of motion, a bearing stud mounted on said carriage with its axis extending perpendicularly to the line of motion of the carriage, rotary means including a spur gear rotatably mounted on said stud, a worm gear rotatably mounted on said bracket means in meshing engagement with said spur gear and with its axis extending parallel to the line of motion of said carriage, means engageable with said carriage to move the same with said spur gear rolling along said worm gear, and means including a spring washer mounted on said stud and frictionally engaging said rotary means to prevent rotation thereof upon rotation of said worm gear so as to provide relative motion between said carriage and said bracket means upon rotation of said worm gear.

12. A tuner drive assembly including in combination, a movable carriage, a wheel rotatably mounted on said carriage, means for imparting rotational motion to said wheel, means having a surface positioned adjacent the periphery of said wheel and engageable therewith so that rotary motion of said wheel will produce relative motion between said movable carriage and said surface, said wheel and said surface being mounted for relative movement and having a first position in which said wheel is disengaged from said surface, and a second position in which said wheel is engaged with said surface, and means to change the relative position of said wheel and said surface between said first and second positions.

References Cited in the file of this patent

UNITED STATES PATENTS

| | | |
|---|---|---|
| 1,665,227 | Smith | Apr. 10, 1928 |
| 1,759,678 | Asbury | May 20, 1930 |
| 2,478,287 | Laschenski | Aug. 9, 1949 |